(12) United States Patent
Johnson et al.

(10) Patent No.: US 7,718,111 B2
(45) Date of Patent: May 18, 2010

(54) PHOTOCURABLE COMPOSITIONS FOR ARTICLES HAVING STABLE TENSILE PROPERTIES

(75) Inventors: David L. Johnson, Saugus, CA (US); Frank Tran, Gardena, CA (US); John Fong, Temple City, CA (US); Richard Leyden, Topanga, CA (US); Ranjana Patel, Bishop's Stortfort Herts (GB)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 319 days.

(21) Appl. No.: 11/786,218

(22) Filed: Apr. 11, 2007

(65) Prior Publication Data

US 2007/0256781 A1 Nov. 8, 2007

Related U.S. Application Data

(62) Division of application No. 10/678,253, filed on Oct. 3, 2003, now Pat. No. 7,232,850.

(51) Int. Cl.
*C08F 2/46* (2006.01)
*B29C 35/04* (2006.01)
*B29C 35/00* (2006.01)
*B29C 35/08* (2006.01)

(52) U.S. Cl. .......................... 264/401; 522/15; 522/17; 522/25; 522/31; 522/90; 522/96; 522/100; 522/104; 522/150; 522/154; 522/157; 522/169; 522/170; 428/411.1; 428/357; 428/364; 428/375; 428/378; 428/383; 428/384; 428/500

(58) Field of Classification Search .................. 522/15, 522/17, 25, 31, 71, 80, 90, 96, 100, 104, 522/169, 170, 150, 153, 154, 157; 428/411.1; 264/401

See application file for complete search history.

(56) References Cited

U.S. PATENT DOCUMENTS

| | | | |
|---|---|---|---|
| 3,708,296 A | 1/1973 | Schlesinger | |
| 4,853,434 A | 8/1989 | Block | |
| 4,942,060 A | 7/1990 | Grossa | |
| 4,942,066 A | 7/1990 | Fan et al. | |
| 5,002,854 A | 3/1991 | Fan et al. | |
| 5,002,855 A | 3/1991 | Fan et al. | |
| 5,219,896 A | 6/1993 | Coady et al. | |
| 5,336,563 A | 8/1994 | Coady et al. | |
| 5,384,342 A | 1/1995 | Szum | |
| 5,399,637 A * | 3/1995 | Willett et al. | 526/142 |
| 5,456,984 A | 10/1995 | Bishop et al. | |
| 5,461,088 A | 10/1995 | Wolf et al. | |
| 5,463,084 A | 10/1995 | Crivello et al. | |
| 5,476,748 A | 12/1995 | Steinmann et al. | |
| 5,502,145 A | 3/1996 | Szum | |
| 5,595,820 A | 1/1997 | Szum | |
| 5,639,413 A | 6/1997 | Crivello | |
| 5,664,041 A | 9/1997 | Szum | |
| 5,707,780 A | 1/1998 | Lawton et al. | |
| 5,932,625 A | 8/1999 | Watanabe et al. | |
| 5,972,563 A | 10/1999 | Steinmann et al. | |
| 5,981,616 A | 11/1999 | Yamamura et al. | |
| 5,986,018 A | 11/1999 | Yajaguchi et al. | |
| 6,013,714 A | 1/2000 | Haruta et al. | |
| 6,013,749 A | 1/2000 | Baba et al. | |
| 6,021,338 A | 2/2000 | Zahora et al. | |
| 6,063,888 A | 5/2000 | Yamaguchi et al. | |
| 6,087,533 A | 7/2000 | Burke | |
| 6,096,796 A | 8/2000 | Watanabe et al. | |
| 6,127,085 A | 10/2000 | Yamamura et al. | |
| 6,174,156 B1 | 1/2001 | Chapman et al. | |
| 6,251,557 B1 * | 6/2001 | Lapin et al. | 430/269 |
| 6,287,745 B1 | 9/2001 | Yamamura et al. | |
| 6,287,748 B1 | 9/2001 | Lawton | |
| 6,306,924 B2 | 10/2001 | Szum | |
| 6,340,297 B1 | 1/2002 | Chapman et al. | |
| 6,355,599 B1 | 3/2002 | Zahora et al. | |
| 6,362,249 B2 | 3/2002 | Chawla | |
| 6,365,644 B1 | 4/2002 | Yamamura et al. | |
| 6,376,571 B1 | 4/2002 | Chawla et al. | |
| 6,379,866 B2 | 4/2002 | Lawton et al. | |
| 6,413,697 B1 | 7/2002 | Melisaris et al. | |
| 6,455,121 B1 * | 9/2002 | Ha et al. | 428/64.1 |
| 6,537,729 B1 | 3/2003 | Lawton | |
| 6,579,914 B1 * | 6/2003 | Gantt et al. | 522/92 |
| 6,749,976 B2 | 6/2004 | Lawton et al. | |
| 6,762,002 B2 | 7/2004 | Lawton et al. | |

(Continued)

FOREIGN PATENT DOCUMENTS

EP 0162304 11/1985

(Continued)

OTHER PUBLICATIONS

Paul F. Jacobs, *Stereolithography and Other RP&M Technologies*, 33-35 (ASME Press 1996).

(Continued)

*Primary Examiner*—Sanza L McClendon (57) ABSTRACT

A photocurable composition comprising cationically curable compound, an acrylate-containing compound; a hydroxyl-containing compound; a cationic photoinitiator; and a free radical photoinitiator; wherein said composition has less than 0.54 equivalents of cationically curable groups, less than 0.10 equivalents of acrylate groups and less than 0.10 equivalents of hydroxyl 0groups per 100 grams of said composition.

16 Claims, 4 Drawing Sheets

U.S. PATENT DOCUMENTS

| | | | |
|---|---|---|---|
| 6,811,937 B2 * | 11/2004 | Lawton | 430/15 |
| 2001/0046642 A1 | 11/2001 | Johnson et al. | |
| 2002/0160309 A1 | 10/2002 | Pang et al. | |
| 2003/0104313 A1 * | 6/2003 | Lawton | 430/280.1 |
| 2003/0149124 A1 * | 8/2003 | Thommes et al. | 522/75 |
| 2004/0142274 A1 * | 7/2004 | Thies et al. | 430/269 |
| 2005/0049739 A1 * | 3/2005 | Kramer et al. | 700/119 |
| 2005/0142479 A1 * | 6/2005 | Thommes et al. | 430/270.1 |

FOREIGN PATENT DOCUMENTS

| | | |
|---|---|---|
| EP | 0360869 | 4/1990 |
| EP | 0646580 | 4/1995 |
| JP | 0275618 | 3/1990 |

OTHER PUBLICATIONS

Christian Decker & Khalil Moussa, *Kinetic Study of the Cationic Photopolymerisation of Epoxy Monomers*, 28 J. Ploym. Sci., Polym. Chem. 3429-43 (1990).

J.V. Crivello, "Photoinitiated Cationic Polymerization," *UV Curing: Science & Technology*, (S P. Pappas, ed., Technology Marketing Corp. 1978).

J.V. Crivello and K. 7Dietliker, "Photoinitiators for Cationic Polymerisation," *Chemistry and Technology of UV & EV Formulation for Coatings, Inks & Paints*327-478 (P.K. Oldring, ed., SITA Technology Ltd. 1991).

Paul F. Jacobs, *Rapid Prototyping & Manufacturing* 69-110 (1992).

Atsushi Udagawa, et al., *Physical Properties and Photoreactivity of Cycloaliphatic Epoxy Resins Cured by UV-Induced Cationic Polymerization* 23 Polym. J. 1081-1090 (1991).

Andreas Harwig, *Influence of Moisture Present During Polymerisation on the Properties of a Photocured Epoxy Resin* 22 Int'l J. of Adhesion & Adhesives 409-414 (2002).

Piotr Penczek, et al., *Epoxypolyesters as Film-Forming Materials*187 Macromol. Symp. 243-244 (2002).

Emmanouil Spyrou, *Radiation Initiated Cationic Polymerization with Tailor-made Polyesters* 43 Progress in Organic Coatings 25-31 (2001).

Ramamurti N. Kumar, et al.,*Application of Real Time FTIR and MAS NMR Spectroscopy to the Characterization of UV/EB Cured Epoxidized Natural Rubber Blends*286 Macromol. Mater. Eng. 598-604 (2001).

Christian Decker, et al., *Photoinitiated Cationic Polymerization of Epoxides* 50 Polym. Int'l 986-997 (2001).

C. Decker, et al., *UV-Radiation Curing of Acrylate/Epoxide Systems* 42 Polymer 5531-5541 (2001).

Naguib Saleh, *Mechanical Properties Under Differing Humidity Conditions & Ageing Characteristics* Design for Rapid Manufacturing (Mar. 2003).

* cited by examiner

PHOTOCURABLE COMPOSITIONS FOR ARTICLES HAVING STABLE TENSILE PROPERTIES

CROSS REFERENCE TO RELATED APPLICATIONS

This application is a divisional application of U.S. patent application Ser. No. 10/678,253, filed Oct. 3, 2003, now U.S. Pat. No. 7,232,850. The noted application is incorporated herein by reference.

FIELD OF THE INVENTION

The present invention relates to photocurable compositions and processes for producing three-dimensional articles using rapid prototyping techniques. Three-dimensional articles produced from the photocurable compositions of the present invention exhibit stable tensile properties over time.

BACKGROUND OF THE INVENTION

Three-dimensional articles produced by rapid prototyping techniques (e.g. stereolithography) tend to increase in brittleness over time. The problem is particularly acute for articles made from resin systems that cure (at least in part) by a cationic mechanism. In general, the cationic reaction initiated by actinic radiation (e.g. a UV laser) continues indefinitely after the radiation ceases. This is known as the "dark reaction" of cationically curable systems. Paul F. Jacobs, *Stereolithography and Other RP&M Technologies* 33-35 (ASME Press 1996); Christian Decker & Khalil Moussa, *Kinetic study of the cationic photopolymerisation of epoxy monomers*, 28 J. Polym. Sci, Polym. Chem. 3429-43 (1990). The cationic reactions continue at an ever slower rate as the amount of unreacted material decreases. As the reaction continues over time, the article becomes more and more brittle, elongation at break decreases, and frequently, tensile strength and tensile modulus increase.

Today, there is a growing need for rapid prototyping materials and processes that produce three-dimensional articles with stable tensile properties. In the past, articles produced by rapid prototyping were initially so brittle that increasing brittleness associated with aging went unnoticed. Also, the issue of brittleness was never confronted because articles were used only in short-term applications.

Once the problem was realized, persons of skill in the art tried to solve it by formulating cationically curable resin systems so as to produce articles with very high initial values for elongation at break and impact strength, in the hopes that useful tensile properties would persist over time. However, this approach brought about compromises in other performance metrics, with the result that overall resin performance was often sacrificed. Other prior attempts to solve the problem were based on the ability of epoxy resins to pick up ambient moisture. Water contained in the polymer matrix acts as a plasticizer and tends to mask brittleness. However, this approach is hard to control because it depends on ambient humidity and dimensional accuracy suffers.

There is, therefore, a need in the art of rapid prototyping for a photocurable composition that produces three-dimensional articles with stable tensile properties. There is a need in the art to get an article possessing combined properties of improved flexibility, tensile strength, thermal resistance and toughness and that the article keeps up these properties a long time in functional use (stability). Today's need, if fulfilled, would result in the cost-effective use of rapid prototyping techniques to produce three-dimensional articles suitable for multiple applications over time. The present invention relates to photocurable compositions comprising high molecular weight, low functionality components that can be used to produce three-dimensional articles with stable tensile properties and thus improved end uses.

SUMMARY OF THE INVENTION

The present invention provides a photocurable composition comprising (a) a cationically curable compound; (b) an acrylate-containing compound; (c) a hydroxyl-containing compound; (d) a cationic photoinitiator; and (e) a free radical photoinitiator; wherein said composition has less than 0.54 equivalents of cationically curable groups, less than 0.10 equivalents of acrylate groups and less than 0.10 equivalents of hydroxyl groups per 100 grams of said composition.

In another aspect, the present invention provides a photocurable composition comprising (a) about 40% to about 80% by weight of a difunctional non-glycidyl epoxy; (b) about 15% to about 35% by weight of a difunctional (meth)acrylate; (c) about 10% to about 20% by weight of a difunctional hydroxyl-containing compound; (d) a cationic photoinitiator; and (e) a free radical photoinitiator. All of the foregoing weight ranges are based on the total weight of the photocurable composition.

There is also provided a process for producing a three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article.

In a further aspect, there is provided a process for forming a three-dimensional article in sequential cross-sectional layers in accordance with a model of the article, the process comprising the steps of: depositing droplets of the photocurable composition of the present invention onto a substrate in a pattern corresponding to a cross-sectional layer of the model so that the adjacent droplets merge together; irradiating the droplets to cure the photocurable composition; and repeating these steps to form successive layers.

Further still, there is also provided a process for forming a three-dimensional article in sequential cross-sectional layers in accordance with a model of the article, the process comprising the steps of: defining a layer of powder material onto a substrate; depositing the photocurable composition of the present invention onto the powder layer in a pattern corresponding to a respective cross-sectional layer of the model; curing the photocurable composition; and repeating these steps to form successive layers.

In addition, there is provided a process, generally as described in the immediately preceding paragraph, wherein the powder material is made from a photocurable composition of this invention, and a photocurable composition of this invention in liquid form, or a different liquid photocurable composition, is deposited onto the powder.

In yet another aspect, processes are provided for bonding digital versatile disc ("DVD") layers together, as well as for depositing stable, human and machine readable characters on the DVD. The latter process for producing readable characters involves coating the non-information bearing surface of a DVD substrate with the photocurable composition, and curing the photocurable composition with UV radiation. The former process of bonding the DVD layers involves creating a bonding layer comprising the photocurable composition between two DVD layers, and curing the photocurable composition with UV radiation.

In another aspect, there is provided a process for producing a coated optical glass fiber, the process comprising the steps of: applying the photocurable composition of the present invention to the optical glass fiber; and curing the photocurable composition.

In yet another aspect, there is provided a process for sealing a light emitting diode, the process comprising the steps of: applying the photocurable composition of the present invention between a P-type semiconductor and an N-type; and applying actinic energy to cure the photocurable composition.

In a further aspect, a curable wax is added to the photocurable composition of the present invention to form a paste that may be jetted, extruded or otherwise mechanically dispensed.

BRIEF DESCRIPTION OF THE DRAWINGS

The present invention may be understood with reference to the following drawing, in which like elements are indicated by like letters. These drawings are provided to illustrate selected embodiments of the present invention and are not intended to limit the scope of the invention.

DETAILED DESCRIPTION OF THE INVENTION

The present invention is directed to a photocurable composition comprising high molecular weight, low functionality components that may be used to produce a three-dimensional article with stable tensile properties.

"Three-dimensional article" means an article made from at least two layers of a cured resin composition.

"Equivalents of cationically curable/acrylate/hydroxyl groups" means the fractional number of active cationically curable/acrylate/hydroxyl groups contained in 100 grams of a photocurable composition.

Cationically Curable Compound

A cationically-curable compound or resin suitable for use in the photocurable composition of this invention is characterized by having functional groups capable of reacting via or as a result of a ring-opening mechanism to from a polymeric network. Examples of said functional groups include oxirane-(epoxide), oxetane, tetrahydropran- and lactone-rings in the molecule. Such resins may have an aliphatic, aromatic, cycloaliphatic, araliphatic or heterocyclic structure: they contain the ring groups as side groups, or the epoxide group can form part of an alicyclic or heterocyclic ring system. Compounds or resins of these types are generally known and are commercially available. In general, any cationically curable compound or resin having the aforementioned functional groups is suitable for use in the photocurable composition of this invention; provided that the composition has less than 0.54 equivalents of cationically curable groups per 100 grams of the composition.

Epoxy-containing compounds are preferred. In general, any epoxy-containing compound is suitable for the present invention provided that the photocurable composition has less than 0.54 equivalents of epoxy groups per 100 grams of the composition. Some examples of epoxy-containing compounds suitable for use in this invention are disclosed in U.S. Pat. No. 5,476,748, U.S. Patent Publication No. 2001/0046642 A1, and U.S. Patent Publication No. 2002/0160309, all of which are incorporated herein by reference.

Preferred epoxy-containing compounds suitable for the present invention are non-glycidyl epoxies. These epoxies may be linear, branched, or cyclic in structure. For examples, there may be included in one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. These epoxies may be linear, branched, or cyclic in structure. Examples are disclosed in U.S. Pat. No. 5,639,413, which is incorporated herein by reference. Still others include epoxides which contain one or more cyclohexene oxide groups and epoxides which contain one or more cyclopentene oxide groups. Examples are disclosed in U.S. Pat. No. 3,117,099, which is incorporated herein by reference.

Particularly suitable non-glycidyl epoxies include the following difunctional non-glycidyl epoxide compounds in which the epoxide groups form part of an alicyclic or heterocyclic ring system: bis(2,3-epoxycyclopentyl)ether, 1,2-bis(2,3-epoxycyclopentyloxy)ethane, 3,4-epoxycyclohexylmethyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate, ethanediol di(3,4-epoxycyclohexylmethyl)ether, vinylcyclohexene dioxide, dicyclopentadiene diepoxide or 2-(3,4-epoxycyclohexyl-5,5-spiro-3, 4-epoxy)cyclohexane-1,3-dioxane, and 2,2'-Bis-(3, 4-epoxy-cyclohexyl)-propane.

Highly preferred difunctional non-glycidyl epoxies include cycloaliphatic difunctional non-glycidyl epoxies such as 3,4-epoxycyclohexyl-methyl 3',4'-epoxycyclohexanecarboxylate and 2,2'-Bis-(3,4-epoxy-cyclohexyl)-propane, with the former being most preferred.

The photocurable composition may include one or more epoxy-containing compounds that are polyglycidyl ethers, poly(β-methylglycidyl)ethers, polyglycidyl esters, poly(β-methylglycidyl)esters, poly(N-glycidyl) compounds, and poly(S-glycidyl) compounds, provided the photocurable composition has less than 0.54 equivalents of epoxy groups per 100 grams of the composition.

The synthesis and examples of polyglycidyl ethers, poly(β-methylglycidyl)ethers, polyglycidyl esters and poly(P-methylglycidyl)esters are disclosed in U.S. Pat. No. 5,972,563, which is incorporated herein by reference.

Particularly important representatives of polyglycidyl ethers or poly(β-methylglycidyl)ethers are based on phenols; either on monocyclic phenols, for example on resorcinol or hydroquinone, or on polycyclic phenols, for example on bis (4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks. Examples of preferred polyglycidyl ethers include trimethylolpropane triglycidyl ether, triglycidyl ether of polypropoxylated glycerol, and diglycidyl ether of 1,4-cyclohexanedimethanol. Examples of particularly preferred polyglycidyl ethers include diglycidyl ethers based on bisphenol A and bisphenol F and mixtures thereof.

Poly(N-glycidyl) compounds are obtainable, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl)methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of Poly(S-glycidyl) compounds are di-S-glycidyl derivatives derived from dithiols, for example ethane-1,2-dithiol or bis(4-mercaptomethylphenyl)ether.

It is also possible to employ epoxy-containing compounds in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Other epoxide derivatives may be employed, such as vinyl cyclohexene dioxide, vinyl cyclohexene monoxide, 3,4-epoxycyclohexlmethyl acrylate, 3,4-epoxy-6-methyl cyclohexylmethyl-9,10-epoxystearate, 1,2-bis(2,3-epoxy-2-methylpropoxy)ethane, and the like.

Also conceivable is the use of liquid pre-reacted adducts of epoxy-containing compounds, such as those mentioned above, with hardeners for epoxy resins. It is of course also possible to use liquid mixtures of liquid or solid epoxy resins in the novel compositions.

The following are examples of commercial epoxy products suitable for use in the present invention: UVA 1500 (3,4-epoxycyclohexylmethyl-3,4-epoxycyclohexanecarboxylate; supplied by UCB Chemicals Corp.), Heloxy 48 (trimethylol propane triglycidyl ether; supplied by Resolution Performance Products LLC), Heloxy 107 (diglycidyl ether of cyclohexanedimethanol; supplied by Resolution Performance Products LLC), Uvacure 1501 and 1502 are proprietary cycloaliphatic epoxides supplied by UCB Surface Specialties of Smyrna, Ga.); Uvacure 1531, Uvacure 1532, Uvacure 1533, and Uvacure 1534 are cycloaliphatic epoxies blended with a proprietary polyol; Uvacure 1561 and Uvacure 1562 are proprietary cycloaliphatic epoxides that have a (meth)acrylic unsaturation in them; UVR-6105 (3,4-epoxycyclohexylmethyl-3,4-epoxycyclohexanecarboxylate), UVR-6100 (3,4-epoxycyclohexylmethyl-3,4-epoxycyclohexanecarboxylate), UVR-6110 (3,4-epoxycyclohexylmethyl-3,4-epoxycyclohexanecarboxylate), UVR-6128 (Bis (3,4-epoxycyclohexyl) Adipate), UVR-6200, UVR-6216 (1,2-Epoxyhexadecane), supplied by Union Carbide Corp. of Danbury, Conn.), the cycloaliphatic epoxides include Araldite CY 179 (3,4-epoxycyclohexylmethyl-3,4-epoxycyclohexanecarboxylate) and PY 284 and Celoxide 2021 (3,4-Epoxycyclohexyl)methyl-3,4-epoxycyclohexyl carboxylate), Celoxide 2021 P (3'-4'-Epoxycyclohexane)methyl 3'-4'-Epoxycyclohexyl-carboxylate), Celoxide 2081 (3'-4'-Epoxycyclohexane)methyl 3'-4'-Epoxycyclohexyl-carboxylate modified-caprolactone), Celoxide 2083, Celoxide 2085, Celoxide 2000, Celoxide 3000, Cyclomer A200 (3,4-Epoxy-Cyclohexlmethyl-Acrylate), Cyclomer M-100 (3,4-Epoxy-Cycloheylmethyl-Methacrylate), Epolead GT-300, Epolead GT-302, Epolead GT-400, Epolead 401, and Epolead 403 (all marketed by Daicel Chemical Industries Co., Ltd.).

The photocurable composition of the present invention may include mixtures of the epoxy-containing compounds described above.

Acrylate-Containing Compound

The acrylate-containing compound of the present invention is preferably ethylenically unsaturated. More preferably, the acrylate-containing compound is a (meth)acrylate. "(Meth)acrylate" refers to an acrylate, a methacrylate, or a mixture thereof. The acrylate-containing compound may include at least one poly(meth)acrylate, e.g., a di-, tri-, tetra- or pentafunctional monomeric or oligomeric aliphatic, cycloaliphatic, or aromatic (meth)acrylate, provided the photocurable composition has less than 0.10 equivalents of acrylate groups per 100 grams of the composition. Difunctional (meth)acrylates are preferred, and aliphatic or aromatic difunctional (meth)acrylates are particularly preferred.

Examples of di(meth)acrylates include di(meth)acrylates of cycloaliphatic or aromatic diols such as 1,4-dihydroxymethylcyclohexane, 2,2-bis(4-hydroxy-cyclohexyl)propane, bis(4-hydroxycyclohexyl)methane, hydroquinone, 4,4'-dihydroxybiphenyl, Bisphenol A, Bisphenol F, Bisphenol S, ethoxylated or propoxylated Bisphenol A, ethoxylated or propoxylated Bisphenol F, and ethoxylated or propoxylated Bisphenol S. Di(meth)acrylates of this kind are known and some are commercially available, e.g., Ebecryl 3700 (Bisphenol-A epoxy diacrylate) (supplied by UCB Surface Specialties). A particularly preferred di(meth)acrylate is a Bisphenol A-based epoxy diacrylate.

Alternatively, the di(meth)acrylate may be acyclic aliphatic, rather than cycloaliphatic or aromatic. Di(meth)acrylates of this kind are known. Examples include compounds of the formulae (F-I) to (F-IV) of U.S. Pat. No. 6,413,697, herein incorporated by reference. Further examples of possible di(meth)acrylates are compounds of the formulae (F-V) to (F-VIII) of U.S. Pat. No. 6,413,697. Their preparation is also described in EP-A-0 646 580, herein incorporated by reference. Some compounds of the formulae (F-I) to (F-VIII) are commercially available.

A poly(meth)acrylate suitable for the present invention may include a tri(meth)acrylate or higher provided the photocurable composition has less than 0.10 equivalents of acrylate groups per 100 grams of the composition. Examples are the tri(meth)acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the triols listed above) with (meth)acrylic acid. Other examples are pentaerythritol tetraacrylate, bistrimethylolpropane tetraacrylate, pentaerythritol monohydroxytri(meth)acrylate, or dipentaerythritol monohydroxypenta (meth)acrylate.

The poly(meth)acrylate may include polyfunctional urethane (meth)acrylates. Urethane (meth)acrylates may be prepared by, e.g., reacting a hydroxyl-terminated polyurethane with acrylic acid or methacrylic acid, or by reacting an isocyanate-terminated prepolymer with hydroxyalkyl(meth) acrylates to give the urethane (meth)acrylate.

Examples of suitable aromatic tri(meth)acrylates are the reaction products of triglycidyl ethers of trihydric phenols, and phenol or cresol novolaks containing three hydroxyl groups, with (meth)acrylic acid.

Preferably, the acrylate-containing compound includes a compound having at least one terminal and/or at least one pendant (i.e., internal) unsaturated group and at least one terminal and/or at least one pendant hydroxyl group. The photocurable composition of the present invention may contain more than one such compound. Examples of such compounds include hydroxy mono(meth)acrylates, hydroxy poly (meth)acrylates, hydroxy monovinylethers, and hydroxy polyvinylethers. Commercially available examples include dipentaerythritol pentaacrylate (SR® 399; supplied by SARTOMER Company), pentaerythritol triacrylate (SR® 444; supplied by SARTOMER Company), and bisphenol A diglycidyl ether diacrylate (Ebecryl 3700; supplied by UCB Surface Specialties).

The following are examples of commercial poly(meth)acrylates: SR® 295 (Pentaerythritol tetracrylate), SR® 350 (trimethylolpropane trimethacrylate), SR® 351 (Trimethylolpropane triacrylate), SR® 367 (Tetramethylolmethane tetramethacrylate), SR® 368 (tris(2-acryloxy ethyl) isocyanurate triacrylate), SR® 399 (dipentaerythritol pentaacrylate), SR® 444 (pentaerythritol triacrylate), SR® 454 (Ethoxylated (3) trimethylolpropane triacrylate), SR® 9041 (dipentaerythritol pentaacrylate ester), and CN® 120 (bisphenol A-epichlorohydrin diacrylate) (all of the foregoing supplied by SARTOMER Company).

Additional examples of commercially available acrylates include KAYARAD R-526 (Hexanedioic acid, bis[2,2-dimethyl-3-[(1-oxo-2-propenyl)oxy]propyl]ester); Sartomer 238 (Hexamethylenediol diacrylate), SR® 247 (Neopentyl glycol diacrylate), SR® 306 (Tripropylene glycol diacrylate), Kayarad R-551 (Bisphenol A polyethylene glycol diether diacrylate), Kayarad R-712 (2,2'-Methylenebis[p-phenylenepoly(oxyethylene)oxy]diethyl diacrylate), Kayarad R-604 (2-Propenoic acid, [2-[1,1-dimethyl-2-[(1-oxo-2-propenyl) oxy]ethyl]-5-ethyl-1,3-dioxan-5-yl]methyl ester), Kayarad R-684 (Dimethyloltricyclodecane diacrylate), Kayarad PET-30 (Pentaerythritol triacrylate), GPO-303 (Polyethylene glycol dimethacrylate), Kayarad THE-330 (Ethoxylated trimethylolpropane triacrylate), DPHA-2H, DPHA-2C and DPHA-21 (dipentaerythritol hexaacrylate), Kayarad D-310 (DPHA), Kayarad D-330 (DPHA), DPCA-20, DPCA-30, DPCA-60, DPCA-120, DN-0075, DN-2475, Kayarad T-1420 (Ditrimethylolpropane tetraacrylate), Kayarad T-2020 (Ditrimethylolpropane tetraacrylate), T-2040, TPA-320, TPA -330, Kayarad RP-1040 (Pentaerythritol ethoxylate tetraacrylate), R-011, R-300, R-205 (Methacrylic acid, zinc salt, same as SR® 634) (Nippon Kayaku Co., Ltd.), Aronix M-210, M -220, M-233, M-240, M-215, M-305, M-309, M-310, M-315, M-325, M-400, M-6200, M-6400 (Toagosei Chemical Industry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX -8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

The photocurable composition of the present invention may include mixtures of the acrylate-containing compounds described above.

Hydroxyl-Containing Compound

The photocurable composition of the present invention contains one or more hydroxyl-containing compounds. Preferably the hydroxyl-containing compound is difunctional. More preferably, the difunctional hydroxyl-containing compound is a polyether polyol. Most preferably, the polyether polyol is a polytetramethylene ether glycol ("poly THF"). The poly THF preferably has a molecular weight from about 250 to about 2500. The poly THF may be terminated with hydroxy, epoxy, or ethylenically unsaturated group(s). Polytetramethylene ether glycols are commercially available in the Polymeg® line (Penn Specialty Chemicals). Preferably, the photocurable composition of the present invention includes Polymeg® 1000, which is a linear diol with a nominal molecular weight of 1000 g.

Cationic Photoinitiator

The cationic photoinitiator may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators. Onium salt and metallocene salt photoinitiators are described in U.S. Pat. No. 3,708,296; "UV-Curing, Science and Technology", (S. P. Pappas ed., Technology Marketing Corp.) and J. V. Crivello and K. Dietliker, "Photoinitiators for Cationic Polymerisation", *Chemistry & Technology of UV & EB Formulations for Coatings, Inks & Paints,* 327-478 (P. K. Oldring, ed., SITA technology Ltd 1991), each of which is incorporated herein by reference.

Examples of commercial cationic photoinitiators include UVI-6974 and UVI-6976 (which are a mixture of S,S,S,S'-Tetraphenylthiobis(4,1-phenylene)disulfonium dihexafluoroantimonate and diphenyl(4-phenylthiophenyl)sulfonium hexafluoroantimonate), UVI-6970, UVI-6960, UVI-6990 (DOW Corp.), CD010, CD-1011, CD-1012 (Sartomer Corp.), Adekaoptomer SP150, SP-151, SP-170, SP-171 (Asahi Denka Kogyo Co., Ltd.), Irgacure 261 (Ciba Specialty Chemicals Corp.), CI-2481, CI-2624, CI-2639, C12064 (Nippon Soda Co, Ltd.), and DTS-102, DTS-103, NAT-103, NDS-103, TPS-103, MDS-103, MPI-103, BBI-103 (Midori Chemical Co, Ltd.). Most preferred are UVI-6974, CD-1010, UVI-6976, Adekaoptomer SP-170, SP-171, CD-1012, and MPI-103. Especially preferred is a mixture of S,S,S,S'-Tetraphenylthiobis(4,1-phenylene)disulfonium dihexafluoroantimonate and diphenyl(4-phenylthiophenyl)sulfonium hexafluoroantimonate. The cationic photoinitiators can be used either individually or in combination of two or more.

Free Radical Photoinitiator

The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin® TPO); bisacylphosphine oxides; benzophenones, e.g., benzophenone and 4,4'-bis(N,N'-di-methylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure 2959; Ciba Specialty Chemicals); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure 184 (Ciba Specialty Chemicals).

For stereolithography using a laser, the cationic and radical photoinitiators are preferably selected and their concentrations are preferably adjusted to achieve an absorption capacity such that the depth of cure at the normal laser rate is from about 0.1 to about 2.5 mm. "Stereolithography" is a process that produces solid objects from computer-aided design ("CAD") data. CAD data of an object is first generated and then is sliced into thin cross sections. A computer controls a laser beam that traces the pattern of a cross section through a liquid plastic, solidifying a thin layer of the plastic corresponding to the cross section. The solidified layer is recoated with liquid plastic and the laser beam traces another cross section to harden another layer of plastic on top of the previous one. The process continues layer by layer to complete the part. A desired part may be built in a matter of hours. This process is described in U.S. Pat. No. 5,476,748, U.S. Patent Publication No. 2001/0046642, and Paul F. Jacobs, *Rapid Prototyping & Manufacturing* 69-110 (1992), the entire contents of these documents are incorporated herein by reference.

Other Components

The photocurable composition of the present invention may contain a variety of other components. Examples of such components include, e.g., modifiers, tougheners, stabilizers, antifoaming agents, leveling agents, thickening agents, flame retardants, antioxidants, pigments, dyes, fillers, and combinations thereof.

The photocurable composition may contain reactive fillers. For example, the composition may contain reactive particles comprising a crosslinked polysiloxane core and a shell containing reactive groups. The crosslinked polysiloxane core may be a crosslinked polyorganosiloxane rubber that may include dialkylsiloxane repeating units, where "alkyl" is $C_1$-$C_6$ alkyl. The crosslinked polysiloxane core preferably includes dimethylsiloxane repeating units. The reactive groups of the shell preferably include epoxy groups, ethylenically unsaturated groups, and/or hydroxy groups. For example, the reactive groups may include oxirane, glycidyl, vinyl ester, vinyl ether, or acrylate groups, or combinations thereof. The reactive particles preferably have an average particle diameter of about 0.01 to about 50 μm, more preferably about 0.1 to about 5 μm, most preferably about 0.1 to about 3 μm. Preferred reactive particles that are available commercially are Albidur EP 2240 (silicone-epoxy particles in Bisphenol A epoxy resin), Albidur VE 3320 (silicone-vinyl esther particles in Bisphenol A vinyl esther, in styrene), and Albidur EP 5340 (silicone-epoxy particles in cycloaliphatic epoxy resin), all supplied by Hanse Chemie, Germany). Preferably, the reactive particles are added to the photocurable composition as a mixture of the reactive particles and a reactive liquid medium containing, e.g., epoxy or ethylenically unsaturated groups. For example, in Albidur EP 2240, the reactive organosiloxane particles are dispersed in bisphenol A glycidyl ether, in bisphenol A vinyl ester for Albidur VE 3320, and in cycloaliphatic epoxide for Albidur EP 5340.

The photocurable composition of the present invention may also contain one or more stabilizers. Preferred stabilizers are butylated hydroxytoluene ("BHT"), 2,6-Di-tert-butyl-4-hydroxytoluene, and hindered amines, e.g., benzyl dimethyl amine ("BDMA"), N,N-Dimethylbenzylamine.

In one embodiment of the present invention, the photocurable composition comprises a cationically curable compound, an acrylate-containing compound, a hydroxyl-containing compound, a cationic photoinitiator, and a free radical photoinitiator, wherein the composition has less than 0.54 equivalents of cationically curable groups, less than 0.10 equivalents of acrylate groups and less than 0.10 equivalents of hydroxyl groups per 100 grams of said composition. Preferably, the photocurable composition comprises about 0.46 to about 0.51 equivalents of cationically curable groups, about 0.048 to about 0.080 equivalents of acrylate groups, and about 0.03 equivalents of hydroxyl groups per 100 grams of the composition. In all the foregoing embodiments, the cationically curable compound is preferably an epoxy containing compound and the cationically curable groups are epoxy groups.

In another embodiment of the present invention, the photocurable composition comprises about 40% to about 80% by weight of a difunctional non-glycidyl epoxy, about 15% to about 35% by weight of a difunctional (meth)acrylate, about 10% to about 20% by weight of a difunctional hydroxyl-containing compound, a cationic photoinitiator, and a free radical photoinitiator. Preferably, the photocurable composition comprises about 50% to about 70% by weight of a difunctional non-glycidyl epoxy, about 15% to about 25% by weight of a difunctional (meth)acrylate, about 13% to about 17% by weight of a difunctional hydroxyl-containing compound, a cationic photoinitiator, and a free radical photoinitiator. More preferably, the photocurable composition comprises about 55% to about 60% by weight of a difunctional non-glycidyl epoxy, about 17% to about 20% by weight of a difunctional (meth)acrylate, about 15% to about 16% by weight of a difunctional hydroxyl-containing compound, a cationic photoinitiator, and a free radical photoinitiator.

The epoxy-containing compound of the photocurable composition preferably comprises a difunctional epoxy and no multi-functional epoxies. This minimizes the concentration of cationically curable groups, which continue to cure indefinitely even after the illumination (e.g. a UV laser) is removed. Similarly, the photocurable composition of the present invention preferably does not contain any glycidyl epoxies, which react at a slower rate compared to cycloaliphatic epoxies. Surprisingly, applicants have found that the absence of glycidyl epoxies in the photocurable composition promotes stable tensile properties in three-dimensional articles made from the composition.

The acrylate-containing compound of the photocurable composition preferably does not contain any tri-functional or higher acrylates.

Preferably, the photocurable composition of the present invention contains a high molecular weight, difunctional (meth)acrylate (said molecular weight preferably being from about 200 to about 500) and a high molecular weight, difunctional polyol (said molecular weight preferably being from about 250 to about 2500) to dilute the concentration of the cationically curable groups. The most preferred weight for the difunctional (meth)acrylate is 500 g/mole g (CN® 120).

The most preferred weight for the difunctional hydroxyl is 1000 g/mole (Polymeg1000).

The photocurable compositions of the present invention are formulated so as to enable the production of three-dimensional articles having stable tensile properties. In particular, it is possible to build articles from said compositions, which after imaging, curing and storage at 25° C. and 50% relative humidity) have a tensile strength that increases by less than about 21% over 51 days; ii) have a tensile modulus that increase by less than about 14% over 51 days; and iii) have an elongation at break that decreases by less than 47% over 51 days.

Stereolithography

A further aspect of the present invention includes a process for producing a three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article.

In principle, any stereolithography machine may be used to carry out the inventive method. Stereolithography equipment is commercially available from various manufacturers. Table I lists examples of commercial stereolithography equipment available from 3D Systems Corp. (Valencia, Calif.).

TABLE I

Stereolithography Machines

| MACHINE | WAVELENGTH (nm) |
| --- | --- |
| SLA ® 250 | 325 |
| SLA ® 500 | 351 |
| SLA ® 3500 | 355 |
| SLA ® 5000 | 355 |
| SLA ® 7000 | 355 |
| Viper si2 ™ | 355 |

Most preferably, the stereolithography process for producing a three-dimensional article from the photocurable composition of the present invention includes preparing the surface of the composition to form the first layer and then recoating the first layer and each successive layer of the three-dimensional article via a recoating step with a Zephyr™ recoater (3D Systems Corp., Valencia, Calif.) or an equivalent thereof.

Although the photocurable composition of the present invention is preferably used in a stereolithography process, it may also be used in three-dimensional jet printing or other rapid prototyping techniques, in the manufacture of digital versatile discs ("DVDs"), as a coating for optical fibers, as a sealant for a light emitting diode, in combination with a curable wax to form a paste, and in any other process or method wherein a photocurable composition having stable tensile properties is desired.

Other Rapid Prototyping Applications

There is provided herein a process for producing a three-dimensional article by jet depositing the photocurable composition of the present invention. The process comprises depositing successive droplets of the photocurable composition (e.g. using an inkjet print head) and irradiating the droplets to cure the composition, the droplets being deposited in accordance with a desired shape as stored in a computer file, such as a CAD file. The photocurable composition can be deposited on any substrate, e.g. paper, textiles, tiles, printing plates, wallpaper, plastic (e.g. vinyl) substrates, metal powder, paste or on prior layers of itself, which is a useful way of building a three-dimensional article.

Alternatively, it is possible to deposit the photocurable composition of the present invention onto a powder. Essentially, the process involves spreading a thin layer of powder onto a substrate and jet depositing the photocurable composition on desired areas of the powder in a desired pattern. The pattern is then cured by exposure to UV light. A further layer of powder may be placed on top of the first layer and the process repeated to build up a three-dimensional article. Any uncured powder is removed after the three-dimensional article has been built. In one embodiment of the process, the powder material comprises a reactive component that either reacts with the photocurable composition, or is facilitated by the photocurable composition to react with itself.

In a further embodiment of the rapid prototyping powder-based process, the powder material is made from a photocurable composition of this invention, and a photocurable composition of this invention in liquid form, or a different liquid photocurable composition, is deposited on the powder. In a preferred embodiment of this process, a photocurable composition of this invention comprising one or more high molecular weight glycidyl epoxies is advanced with an amine or an alcohol and converted to a powder. Onto the resulting powder, there may be jetted a liquid photocurable composition of this invention comprising one or more nonglycidyl epoxies.

The deposited photocurable composition is preferably irradiated immediately upon deposition. A final heat and/or radiation cure may be provided of the whole three-dimensional article after removal of the non-cured powder. Typical cure conditions are 30 minutes at 80° C. and/or exposure to radiation in a flood curing system such as in a Post Curing Apparatus commonly used in stereolithography.

Further still, there is provided a process for producing a three-dimensional article by jet depositing the photocurable composition of the present invention onto a reactive powder. The process comprises the steps of: defining a layer of powder material; applying the photocurable composition of the present invention onto the powder layer in a pattern corresponding to a respective cross-sectional layer of the model; and repeating these steps to form successive layers; wherein the powder material comprises a reactive component that is capable of reacting with the photocurable composition of the present invention or is facilitated by the photocurable composition to react with itself. The powder and the photocurable composition react chemically to form bonds between layers, which gives rise to the dissolution of the powder by the photocurable composition producing a viscous resin.

The process may include a further step of irradiating the article. The article may be irradiated pixel by pixel, line by line or layer by layer, and/or after several layers have been formed, and/or after all the layers have been formed. Preferably, electromagnetic radiation is employed. Suitable sources include UV light, microwave radiation, visible light, laser beams, and other similar sources.

Preferably the powder comprises reactive organic or organometallic polymers, oligomers or monomers. The powder may also contain an organic or inorganic filler, a pigment, nanoparticles, a dye and/or a surfactant.

Examples of suitable powders are polyacrylic acid, poly (acrylonitrile-co-butadiene), poly(allylamine), polyacrylic resins with functional acrylate groups, polybutadiene, epoxy functionalised butadienes, poly(glycidyl(meth)acrylate), polyTHF, polycaprolactone diols, HEMA, HEA, maleic anhydride polymers, e.g. styrene-maleic anhydride, polyvinylbutyrals, polyvinyl alcohol, poly(4-vinylphenol), copolymers/blends of these compounds, and any of these compounds end-capped with epoxy, vinyl ether, acrylate/methacrylate, hydroxy, amine or vinyl moieties, as appropriate.

DVD Manufacture

As noted above, the photocurable composition of the present invention may be used in the manufacture of DVDs. The photocurable composition may be used for the creation of stable, human and machine readable characters on the DVD. This process involves coating the non-information bearing surface of a DVD substrate (e.g. a polycarbonate substrate) with the photocurable composition, and curing the composition with UV radiation. The coating step may be accomplished by screen printing, ink jetprinting, or other suitable methods known in the art. The opposite surface of the substrate may be pre-coated with an aluminum, gold or other layer encoded with audio, video or other information and protected by a UV curable layer (e.g. a lacquer. The photocurable composition may be a thixotropic mixture and may contain pigments, visible or infrared dyes, and other common additives.

The photocurable composition may be sued as a bonding composition in a process for bonding two or more DVD layers together to form multilayer DVDs. The DVDs may be pre-recorded or recordable. The process entails the creation of a bonding layer comprising the photocurable composition applied between two DVD layers, and curing the composition with UV radiation. The photocurable composition used in this process may be thixotropic or flowable. The composition may be applied between, or one, or both of the DVD layers to be bonded is then cured with UV radiation at a dose of about 0.2-1.0 J/cm$^2$, preferably about 0.4 J/cm$^2$. Optionally, the DVD layers having the UV-cured bonding layer between then are pressed together, and the photocurable composition is allowed to "dark" cure in the absence of additional UV radiation. As a result, a single DVD is formed having one or preferably two layers of encoded audio or video information which may be read in a DVD player. This procedure allows for faster through-put through the production line as only a short UV exposure is required to activate the curing mechanisms and full cationic dark cure occurs to create stable bonding characteristics.

Figure 1:
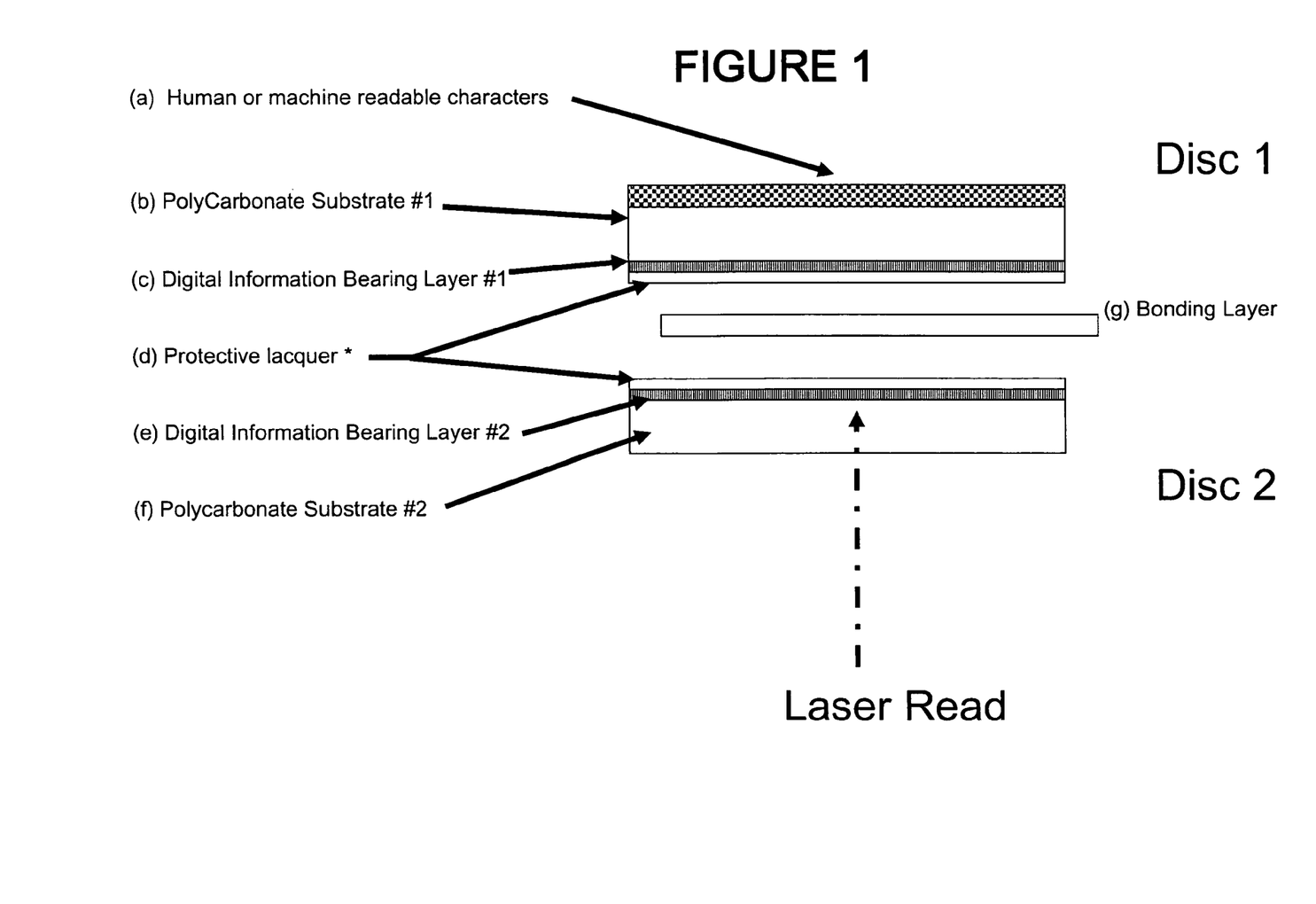
FIG. 1 is a detailed block diagram of one embodiment of the process for bonding DVD discs together.

FIG. 1 depicts a particular embodiment, wherein the photocurable composition of the invention is presented as (g) a bonding layer, which is applied between Disc 1 and Disc 2. Disc 1 comprises (b) a polycarbonate substrate #1 that contains (a) human or machine readable characters on one side and (c) a digital information bearing layer #1 on the opposite side, which is coated with (d) a protective lacquer. Disc 2 comprises (f) a polycarbonate #2 that contains (e) a digital information bearing layer #2 on one side, which is coated with (d) a protective lacquer. The opposite side of Disc 2 is transparent and allows for UV radiation to pass through to (g) the bonding layer to effectuate the curing of the bonding layer. Optionally, Disc 1 and Disc 2 are pressed together.

Optical Fibers

Also provided herein is a process for producing a coated optical glass fiber, wherein said fiber is coated with the photocurable composition of the present invention. Optical fibers made from drawn glass are used as a transmission medium in telecommunication cables. Such fibers need to be coated with a polymeric composition to protect the fiber. The process comprises applying the photocurable composition of the present invention to an optical glass fiber and thereafter curing the photocurable composition by exposing it to actinic radiation.

Light Emitting Diode

The photocurable composition of the present invention may also be used in a process for sealing a light emitting diode. A light emitting diode ("LED") is a semiconductor device that emits visible light when an electric current passes through it. It is transparent and will allow visible or infrared energy to pass through. It consists of two elements of processed material called P-type semiconductors and N-type semiconductors. These two elements are placed in direct contact, forming a region called the P-N junction. The photocurable composition of the present invention can be applied between the P-type semiconductor and the N-type semiconductor as a sealant. The process comprises applying the photocurable composition of the present invention between a P-type semiconductor and an N-type semiconductor and thereafter curing the photocurable composition by exposing it to actinic energy such as visible light or ultraviolet light.

Curable Wax

The present invention provides for the addition of a curable or "reactive" wax to the photocurable composition of the present invention to form a paste that may be jetted, extruded or otherwise mechanically dispensed. "Reactive" wax refers to a wax that includes a moiety that is reactive with the photocurable composition of the present invention by becoming chemically bound to the photocurable composition. Reactive moieties include hydroxyl, carboxyl, isocyanato, thiol, amino, epoxy and vinyl groups, although hydroxyl and carboxyl groups are preferred. Waxes useful in the present invention should have a molecular weight of about 50 to 10,000, more preferably, about 400 to 1000. They should also be primarily hydrocarbon in nature; i.e., they should contain at least about 85% by weight hydrogen and carbon.

Examples of curable, reactive waxes that are useful in the present invention include the following, all of which are available from Petrolite Corp.: the CARDIS series of carboxyl-functional, oxidized microcrystalline waxes such as CARDIS 320; various carboxyl-functional, oxidized polyethylene waxes such as C-4040, C-9500, E-1040 and E-2020; the UNILIN series of saturated, linear primary alcohols such as UNILIN 425, UNILIN 550, UNILIN 700, UNILIN 850 and UNILIN 1000 (derived from polyethylene); the UNICID series of saturated, linear, primary carboxylic acids derived from polyethylene such as UNICID 700; and the UNITHOX series of ethoxylated, linear primary alcohols such as UNITHOX 450, UNITHOX 480, UNITHOX 550 and UNITHOX 750.

Those skilled in the art will appreciate that the various embodiments described above and in the experimental section that follow are meant to be exemplary, and that the invention may be practiced otherwise than as specifically described herein yet still within the scope of the claims and equivalents thereto.

EXAMPLES

The general procedure used for preparing three-dimensional articles with stereolithography equipment is as follows. The photocurable composition is placed in a vat designed for use with the stereolithography equipment. The photocurable composition is poured into the vat within the machine at about 30° C. The surface of the composition, either in its entirety or in accordance with a predetermined pattern, is irradiated with a UV/VIS light source so that a layer of a desired thickness is cured and solidified in the irradiated area. A new layer of the photocurable composition is formed on the solidified layer. The new layer is likewise irradiated over the entire surface or in a predetermined pattern. The newly solidified layer adheres to the underlying solidified layer. The layer formation step and the irradiation step are repeated until a green model of multiple solidified layers is produced.

A "green model" is a three-dimensional article initially formed by the stereolithography process of layering and photocuring, where typically the layers are not completely cured. This permits successive layers to better adhere by bonding together when further cured. "Green strength" is a general term for mechanical performance properties of a green model, including modulus, strain, strength, hardness, and layer-to-layer adhesion. For example, green strength may be reported by measuring flexural modulus (ASTM D 790). An object having low green strength may deform under its own weight, or may sag or collapse during curing.

The green model is then washed in tripropylene glycol monomethyl ether ("TPM") and subsequently rinsed with water and dried with compressed air. The dried green model is next postcured with UV radiation in a postcure apparatus ("PCA") for about 60-90 minutes. "Postcuring" is the process of reacting a green model to further cure the partially cured layers. A green model may be postcured by exposure to heat, actinic radiation, or both.

Examples 1-10

Table III lists the components of each photocurable composition labeled as Examples 1-10. The numbers in Table III refer to the weight percent of each component based on the total weight of the photocurable composition. Table III also lists the equivalents of the epoxy, acrylate and hydroxyl groups present per 100 grams of each photocurable composition. Table IV provides further identifying information for the trade names in Table III.

TABLE III

| Components | 1 (Comparative) | 2 | 3 | 4 | 5 | 6 | 7 | 8 | 9 | 10 |
|---|---|---|---|---|---|---|---|---|---|---|
| | | | | | Percent by Weight | | | | | |
| Epoxies | | | | | | | | | | |
| UVACURE 1500 | 49.0 | 63.0 | 57.0 | 57.0 | 47.0 | 57.0 | 57.0 | 54.0 | 57.00 | 45.00 |
| Heloxy 48 | 8.0 | | | | 8.0 | | | | | |
| Heloxy 107 | 8.0 | | | | | | | | | 12.00 |
| Albidur EP 2240 | 3.0 | 3.0 | 3.0 | 3.0 | 3.0 | 3.0 | 3.0 | 5.0 | 3.00 | 3.00 |
| Acrylates | | | | | | | | | | |
| SR 399 | 3.0 | | | | | | | | | |
| SR 368 | 10.0 | | | | | | | | | |
| CN 120 | | 12.0 | 18.0 | 18.0 | 20.0 | 18.0 | 18.0 | 20.0 | 18.00 | 18.00 |
| Polyols | | | | | | | | | | |
| Polymeg 1000 | 6.0 | 15.0 | 15.0 | 15.0 | 15.0 | 15.0 | 15.0 | 15.0 | 15.0 | 15.0 |
| CHDM | 6.0 | | | | | | | | | |
| L 650 | | | | | | | | | | |
| Photo initiators | | | | | | | | | | |
| I-184 | 2.0 | 2.0 | 2.0 | 2.0 | 2.0 | 2.5 | 2.5 | 2.0 | 2.0 | 2.0 |
| UVI 6976 | 5.0 | 5.0 | 5.0 | 5.0 | 5.0 | 4.5 | 4.5 | 4.0 | 4.95 | 4.95 |
| Stabilizer | | | | | | | | | | |
| BDMA DY062 | 0.03 | 0.03 | 0.03 | 0.03 | 0.03 | 0.03 | 0.03 | 0.03 | 0.03 | 0.03 |
| BHT | | | | | 0.02 | | 0.033 | 0.02 | 0.02 | 0.02 |
| Total % weight | 100.03 | 100.03 | 100.03 | 100.05 | 100.03 | 100.03 | 100.06 | 100.03 | 100.00 | 100.00 |
| Equivalents | | | | | | | | | | |
| Epoxy/100 g | 0.54 | 0.51 | 0.46 | 0.46 | 0.46 | 0.46 | 0.46 | 0.46 | 0.46 | 0.46 |
| Acrylate/100 g | 0.10 | 0.048 | 0.072 | 0.072 | 0.080 | 0.072 | 0.072 | 0.080 | 0.072 | 0.072 |
| Hydroxyl/100 g | 0.10 | 0.03 | 0.03 | 0.03 | 0.03 | 0.03 | 0.03 | 0.03 | 0.03 | 0.03 |

TABLE IV

Definitions for Trade Names

| Trade Name | Source | Chemical Name |
|---|---|---|
| UVACURE 1500 | UCB Surface Specialties | 3,4-Epoxycyclohexylmethyl 3',4'-epoxycyclohexanecarboxylate |
| Heloxy 48 | Resolution Performance Products LLC | Trimethylolpropane triglycidyl ether |
| Heloxy 107 | Resolution Performance Products LLC | Diglycidyl ether of CHDM |
| Albidur EP 2240 | Hanse Chemie | Silicone-epoxy particles in Bisphenol A epoxy resin |
| Polymeg 1000 | Penn Specialty Chemicals | Polytetramethylene ether glycol (MW ca. 1000) |
| CHDM | Aldrich Chemical Co. | 1,4-Cyclohexanedimethanol |
| L 650 | Bayer Corporation | Glycerol, propoxylated |
| SR® 368 | Sartomer Co. | Tris(2-hydroxy ethyl) isocyanurate triacrylate |
| SR® 399 | Sartomer Co. | Dipentaerythritol pentaacrylate |
| CN® 120 | Sartomer Co. | Bisphenol A Epoxy Diacrylate |
| Irgacure 184 | Ciba Specialty Chemicals | 1-hydroxycyclohexyl phenyl ketone |
| Cyracure UVI 6976 | Dow Chemical Company | Mixture of $PhS\text{-}(C_6H_4)\text{—}S + Ph_2\ SbF_6$ and $Ph_2S + \text{—}(C_6H_4)S(C_6H_4)S + Ph_2\ (SbF_6\text{—})_2$ |
| BDMA DY062 | Aceto Corp. | Benzyl-N,N-dimethylamine |
| BHT | Aldrich Chemical | 2,6-Di-tert-butyl-4-hydroxytoluene |

Examples 1-10 were prepared by combining the components and mixing at room temperature until the mixture was a homogeneous photocurable composition. Before addition, CN® 120 was heated in order to reduce its viscosity and thereby improve handling. The photospeed of each photocurable composition was measured using the window pane test and is listed below in Table V.

In the window pane test, single layer, square specimens are created by photocuring the liquid composition with a Solid State laser. The thickness of the cured specimen is taken as a measure of the photosensitivity of the liquid resin. The plotting of the resulting layer thickness on a graph against the logarithm of the irradiation energy used gives a "working curve". The slope of the curve is termed $D_p$, which is defined as depth of penetration. The energy value at which the curve passes through the x-axis is termed $E_c$, which is defined as the critical energy. Together, the depth of penetration ($D_p$) and the critical energy ($E_c$) for initiation of polymerization, i.e., the energy at which gelling of the material takes place, define the photospeed.

Three-dimensional articles were prepared on an SLA® 7000 machine using the following parameters:

| PARAMETER | VALUE |
|---|---|
| Minimum Support Height (inch) | 0.4 |
| Layer Thickness (inch) | 0.004 |
| Hatch Overcure (inch) | 0.000 |
| Hatch Spacing (inch) | 0.004 |
| Fill Cure Depth (inch) | 0.010 |
| Fill Spacing (inch) | 0.004 |
| Border Overcure (inch) | 0.009 |
| Resin Temperature (° C.) | 28-30 |
| Zephyr ™ Recoater | |
| Number of Sweeps | 1 |
| Preferred Blade Gap (inch) | 0.004 |

"Minimum Support Height" is the standard default value for the height of the support(s) on the SLA machine. The support(s) on the SLA machine is created between the SLA machine's platform and the three-dimensional article that is being built to compensate for any unevenness in the platform, to raise the article above any screw or fixture that may be protruding from the top of the platform, and to ensure easier removal of the built article.

"Layer Thickness" is the thickness of each layer of the three-dimensional article that is to be built.

"Hatch Overcure" is the depth beyond the layer thickness which is exposed during a given pass (hatch) of the laser.

"Hatch Spacing" is the distance between adjacent hatch vectors.

"Fill Cure Depth" is the absolute depth of curing for the fill vectors on a given pass of fill. Fills are tightly spaced vectors drawn on the regions of the part that form upfacing or down-facing surfaces.

"Fill Spacing" is the distance between adjacent fill vectors.

"Border Overcure" is the depth that the layer is cured past the actual thickness of the layer.

The "Zephyr™ Recoater" is the commercial name for the recoating system employed on the SLA® 7000 and other SLA machines made by 3D Systems Corp. (Valencia, Calif.). It was used to prepare the surface to form the first layer and then used to recoat the first layer and each successive layer of the photocurable composition in Examples 1-10.

"Preferred Blade Gap" is a distance, given in percent of layer thickness, describing the preferred distance between the bottom of the recoater and the last layer of the part at time of sweeping.

Immediately after the three-dimensional articles were imaged on the SLA® 7000 machine, they were washed in

TABLE V

Photospeed

| Example # | 1 | 2 | 3 | 4 | 5 | 6 | 7 | 8 | 9 | 10 |
|---|---|---|---|---|---|---|---|---|---|---|
| Dp | 5.49 | 3.52 | 4.70 | 4.76 | 4.48 | 4.59 | 4.44 | 4.47 | 4.28 | 5.13 |
| Ec | 6.25 | 3.97 | 8.98 | 9.39 | 8.34 | 6.34 | 5.55 | 6.92 | 7.74 | 9.58 |

TPM for 21 minutes, rinsed with water, and dried with pressurized air in a Ramco Parts Washing System™. After drying with pressurized air, the articles were removed from their supports and placed on an elevated glass platform in a PCA and an intensity of at least 320 watts of fluorescent light was delivered over 1.5 hours. Immediately after post-cure was complete, the articles were placed into a humidity chamber set at 25° C., 50% relative humidity.

Fifty-six three-dimensional articles, known as "dogbones", were prepared from each Comparative Example 1, Example 9 and Example 10. The dogbones were 6.5" long, having a 0.300" by 0.125" neck connected by 1.75" by 0.125" "paddles" at each end. The taper of the dogbone from the neck to the "paddles" is defined by ASTM D638.

Tensile measurements were made on seven dogbones from each composition (Comparative Example 1, Example 9 and Example 10). The recorded tensile measurements reflected composite values that were averaged. The first tensile measurements were recorded five days after the articles were placed into the humidity chamber. Subsequent tensile measurements were recorded at seven days after the articles were placed into the humidity chamber and every seven days thereafter. The tensile measurements were made using a United Testing Systems Tensile Tester. Specifications for the United Tensile Testing Tester are given below:

| PARAMETER | VALUE |
|---|---|
| Pre-Test Speed | 5 mm/min |
| Pre-Load | 0.05 kg |
| Test Speed | 5 mm/min |
| Maximum Load | 500 lbs |
| Extensiometer | 1 inch. Model United EZ 2-1, Serial #3971 |

"Pre-Test Speed" is the rate at which the three-dimensional article is pulled taut before the testing begins.

"Pre-Load" is the amount of force that is applied to the three-dimensional article (at the Pre-Test Speed) before the testing begins.

"Test Speed" is the rate at which the three-dimensional article is pulled apart during the test process.

"Maximum Load" is the maximum amount of force that the United Testing Systems Tensile Tester can use when testing a specimen.

"Extensiometer" is a device that grips the three-dimensional article between two teeth having a distance between the teeth of one inch. A spring on the extensiometer measures the distance to which the three-dimensional article is stretched.

Comparative Example 1

The photocurable composition of Comparative Example 1 was made according to the method described above with the components listed in Table III. Dog bones were made therefrom according to the stereolithography process described above. As presented in Table III, the photocurable composition of Comparative Example 1 contains glycidyl (Heloxy 48 and Heloxy 107) and non-glycidyl (Uvacure 1500) epoxies, a triacrylate (SR® 368) and a penta acrylate (SR® 399). The photocurable composition of Comparative Example 1 has 0.54 equivalents of epoxy groups, 0.10 equivalents of acrylate groups, and 0.10 equivalents of hydroxyl groups.

Example 9

The photocurable composition of Example 9 was made according to the method described above with the components listed in Table III. Dog bones were made therefrom according to the stereolithography process described above. As presented in Table III, the photocurable composition of Example 9 contains a high viscosity diacrylate (CN® 120) instead of the triacrylate and penta acrylate of Comparative Example 1. In further contrast to Comparative Example 1, Example 9 contains no glycidyl epoxies. The photocurable composition of Example 9 has 0.46 equivalents of epoxy groups, 0.072 equivalents of acrylate groups, and 0.03 equivalents of hydroxyl groups.

Example 10

The photocurable composition of Example 10 was made according to the method described above with the components listed in Table III. Dog bones were made therefrom according to the stereolithography process described above. As presented in Table III, the photocurable composition of Example 10 contains a high viscosity diacrylate (CN® 120) instead of the triacrylate and penta acrylate of Comparative Example 1. In further contrast to Comparative Example 1, Example 10 contains a reduced amount of the glycidyl epoxy (Heloxy 107). The photocurable composition of Example 10 has 0.46 equivalents of epoxy groups, 0.072 equivalents of acrylate groups, and 0.03 equivalents of hydroxyl groups.

Figure 2:
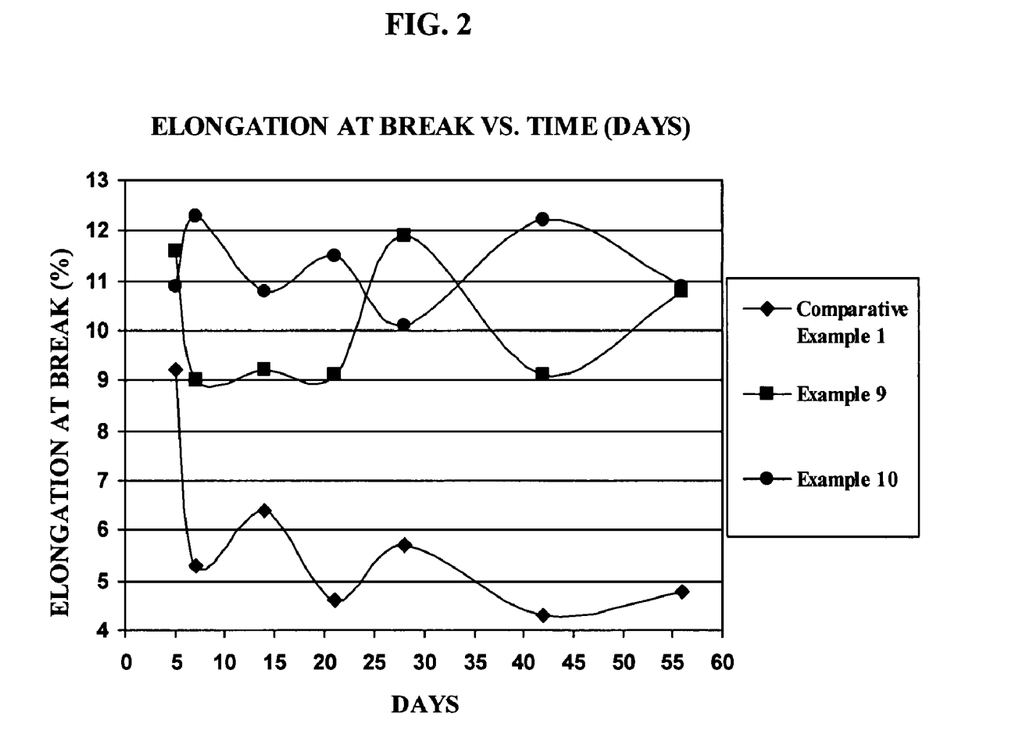
FIG. 2 is a graph showing the change over a period of 51 days in elongation at break for dog bones made from Comparative Example 1, Example 9 and Example 10.
Figure 3:
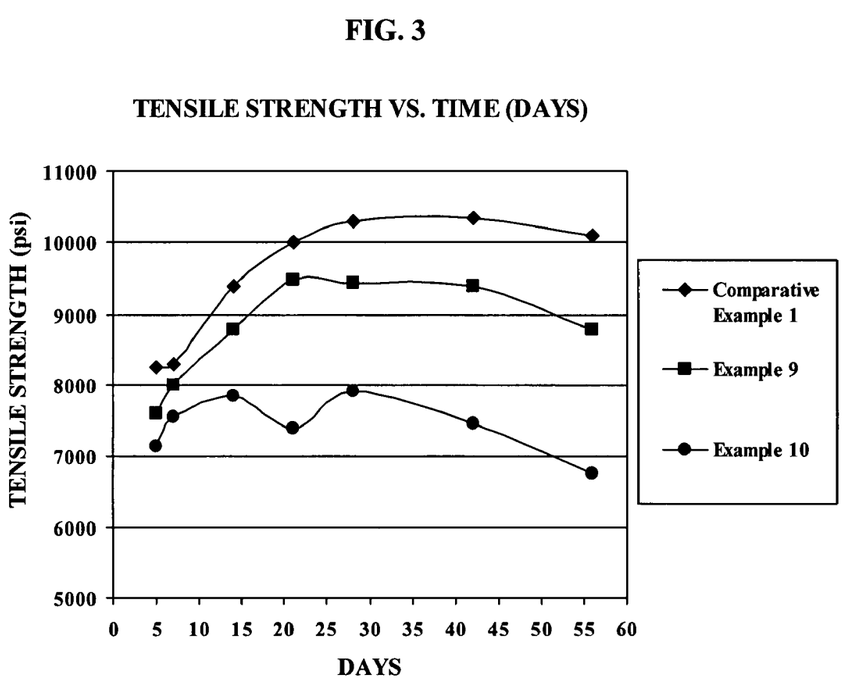
FIG. 3 is a graph showing the change over a period of 51 days in tensile strength for dog bones made from Comparative Example 1, Example 9 and Example 10.
Figure 4:
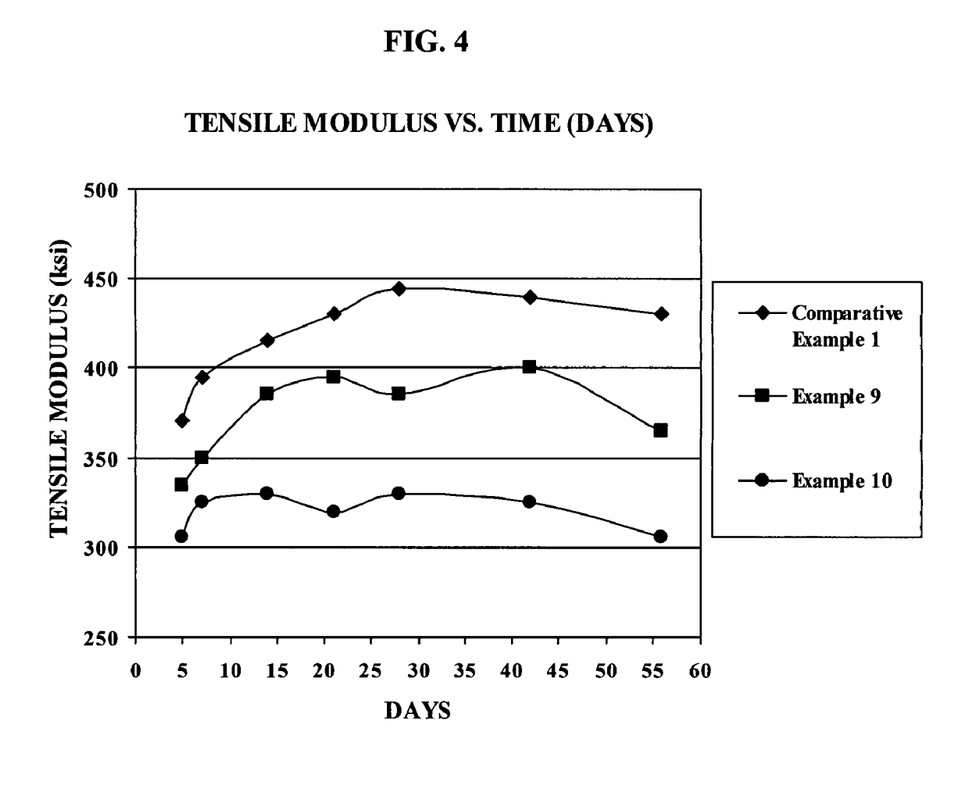
FIG. 4 is a graph showing the change over a period of 51 days in tensile modulus for dog bones made from Comparative Example 1, Example 9 and Example 10.

FIGS. 2, 3 and 4 show the change over a period of 51 days in elongation at break, tensile strength and tensile modulus for dog bones made from Comparative Example 1, Example 9 and Example 10.

Table VI quantifies the change over a period of 51 days in elongation at break, tensile strength and tensile modulus for Comparative Example 1, Example 9 and Example 10. The table presents i) the elongation at break and tensile values for seven samples made from each composition (Comparative Example 1, Example 9 and Example 10) measured 5 days post-cure (having been stored in a humidity chamber set at 25° C. and 50% relative humidity); ii) the same values for seven samples made from each composition (Comparative Example 1, Example 9 and Example 10) measured at 56 days post-cure; iii) the difference between the tensile values measured on Day #5 and on Day #56 shown as a percent change; and iv) the difference between the tensile values measured on Day #5 and Day #56 shown as a percentage of the Day #5 original value.

TABLE VI

| | | Comparative Example 1 | Example 9 | Example 10 |
|---|---|---|---|---|
| Elongation at Break | 5 days post-cure | 9.2 | 11.6 | 10.93 |
| | 56 days post-cure | 4.80 | 10.8 | 10.9 |
| | % change | −47.83 | −6.90 | −0.27 |
| | % of original value | 52.17 | 93.1 | 99.73 |
| Tensile strength | 5 days post-cure | 8297 | 7697 | 7203 |
| | 56 days post-cure | 10059 | 8740 | 6664 |
| | % change | 21.24 | 13.55 | −7.48 |
| | % of original value | 121.24 | 113.55 | 92.52 |
| Tensile Modulus | 5 days post-cure | 373 | 334 | 308 |
| | 56 days post-cure | 427 | 373 | 304 |
| | % change | 14.48 | 11.68 | −1.30 |
| | % of original value | 114.48 | 111.68 | 98.70 |

What is claimed:

1. A process for producing a three-dimensional article in sequential cross-sectional layers in accordance with a model of the article, the process comprising the steps of:
   (1) forming a first layer of a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups per 100 grams of said composition;
   (2) exposing said first layer to actinic radiation in a pattern corresponding to a respective cross-sectional layer of the model sufficient to harden the first layer in the imaged area;
   (3) forming a second layer of said composition above the hardened first layer;
   (4) exposing said second layer to actinic radiation in a pattern corresponding to a respective cross-sectional layer of the model sufficient to harden the second layer in the imaged area; and
   (5) repeating steps (3)-(4) to form successive layers as desired to form said thee-dimensional article.

2. A three-dimensional article produced by the process of claim 1.

3. A process for bonding two or more digital versatile disc (DVD) layers together, the process comprising the steps of:
   (1) combining the components of a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups per 100 grams of said composition;
   (2) applying the mixture to form a bonding layer positioned between two DVD layers to be bonded together;
   (3) curing the photocurable composition with actinic radiation; and
   (4) optionally pressing together the two DVD layers having the cured bonding layer between them.

4. The process of claim 3, wherein the photocurable composition is cured with UV radiation at a dose of about 0.02-1.0 J/cm$^2$.

5. The process of claim 3, wherein the photocurable composition is cured with UV radiation at a dose of about 0.4 J/cm$^2$.

6. A digital versatile disc produced by the process of claim 3.

7. A process for forming a thee-dimensional article in sequential cross-sectional layers in accordance with a model of the article, the process comprising the steps of: jet depositing droplets of a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups onto a substrate in a pattern corresponding to a respective cross-sectional layer of the model so that adjacent droplets merge together; repeating these steps to form successive layers; and applying actinic radiation to cure the photocurable composition, pixel-by-pixel, line-by-line, layer-by-layer, after several layers have been formed and/or after all desired layers have been formed.

8. A thee-dimensional article produced by the process of claim 7.

9. A process for forming a three-dimensional article in sequential cross-sectional layers in accordance with a model of the article, the process comprising the steps of: defining a layer of powder material onto a substrate; jet depositing a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups per 100 grams of said composition onto the powder layer in a pattern corresponding to a respective cross-sectional layer of the model; repeating these steps to form successive layers; and applying actinic radiation to cure the photocurable composition, pixel-by-pixel, line-by-line, layer-by-layer, after several layers have been formed and/or after all desired layers have been formed.

10. A three-dimensional article produced by the process of claim 9.

11. The process of claim 9 characterized in that the powder comprises a reactive component that reacts with the photocurable composition, or is facilitated by the photocurable composition to react with itself.

12. The process of claim 9, wherein the powder is comprised of the photocurable composition.

13. A process for producing a coated optical glass fiber, the process comprising the steps of: applying a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups per 100 grams of said composition to optical glass fiber; and curing the photocurable composition with actinic radiation.

14. A coated optical glass fiber produced by the process of claim 13.

15. A process for sealing a light emitting diode, the process comprising the steps of: applying a photocurable composition comprising (a) a cationically curable compound; (b) an acrylate-containing compound; (c) a hydroxyl-containing compound; (d) a cationic photoinitiator; and (e) a free radical photoinitiator wherein said composition has less than 0.54 equivalents of cationically curable groups, less than 0.10 equivalents of acrylate groups and between less than 0.10 to about 0.03 equivalents of hydroxyl groups per 100 grains of said composition between a P-type semiconductor and an N-type semiconductor; and curing the photocurable composition with actinic radiation.

16. A sealed light emitting diode produced by the process of claim 15.

* * * * *